(12) United States Patent
Decker et al.

(10) Patent No.: US 6,281,433 B1
(45) Date of Patent: Aug. 28, 2001

(54) FACEPLATE FOR NETWORK SWITCHING APPARATUS

(75) Inventors: Robert LeRoy Decker, Parsippany; John David Weld, Ledgewood, both of NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/366,241

(22) Filed: Aug. 3, 1999

(51) Int. Cl.$^7$ ............................................. H05K 9/00
(52) U.S. Cl. ........................... 174/35 R; 174/35 GC; 174/35 MS; 361/816; 361/818
(58) Field of Search ...................... 174/35 MS, 35 R, 174/35 GC; 361/799, 800, 816, 818, 730, 736, 729, 753; 455/300; 206/709, 719, 721

(56) References Cited

U.S. PATENT DOCUMENTS

| | | |
|---|---|---|
| 3,978,378 | 8/1976 | Tigner et al. . |
| 4,327,832 | 5/1982 | De Matteo . |
| 4,906,494 | 3/1990 | Babinec et al. . |
| 5,073,425 * | 12/1991 | Dees, Jr. et al. ................... 428/48 |
| 5,354,950 * | 10/1994 | Golane ............................ 174/35 MS |
| 5,436,803 * | 7/1995 | Annis et al. ........................ 361/818 |
| 5,571,991 | 11/1996 | Highum et al. . |
| 5,574,630 | 11/1996 | Kresge et al. . |
| 5,943,219 * | 8/1999 | Bellino et al. ..................... 361/816 |
| 5,955,164 * | 9/1999 | Miyakawa et al. ................. 428/36.8 |
| 6,110,576 * | 8/2000 | Decker et al. ..................... 428/300.1 |

OTHER PUBLICATIONS

Sparacino, C., "Medical Tubing, Wood Replacement Boost Profile Extrusion Machine Use" *Modern Plastics, Mid–Nov. 1998*, pp. D–61 to D–62.
Survey of Polymer Processing Methods and Machinery, "Introduction to Polymer Processing" pp. 3 to 10.
"Extrusion" vol. 6, pp. 608 to 613.

* cited by examiner

Primary Examiner—Dean A. Reichard
Assistant Examiner—Carmelo Oliva
(74) Attorney, Agent, or Firm—Lowenstein Sandler PC

(57) ABSTRACT

A faceplate for network switching apparatus is formed of a multi-layered structure having a first material layer and a second material layer. An outer portion of the faceplate is formed of the first material layer. The first material layer is an anti static material. An inner portion of the faceplate is formed of the second material layer. The second material layer is formed of an electromagnetic interference (EMI) shielding material. The first material layer and the second material layer are formed of polymeric materials which are rigid after extrusion. In an alternative embodiment, a gasket is coextruded with the first material layer and the second material layer. The gasket protrudes laterally from the inner portion of the faceplate along the length thereof. The gasket is formed of a third material layer. The third material layer is an EMI shielding material. The third material layer is formed of a polymeric material which is flexible after extrusion.

26 Claims, 7 Drawing Sheets

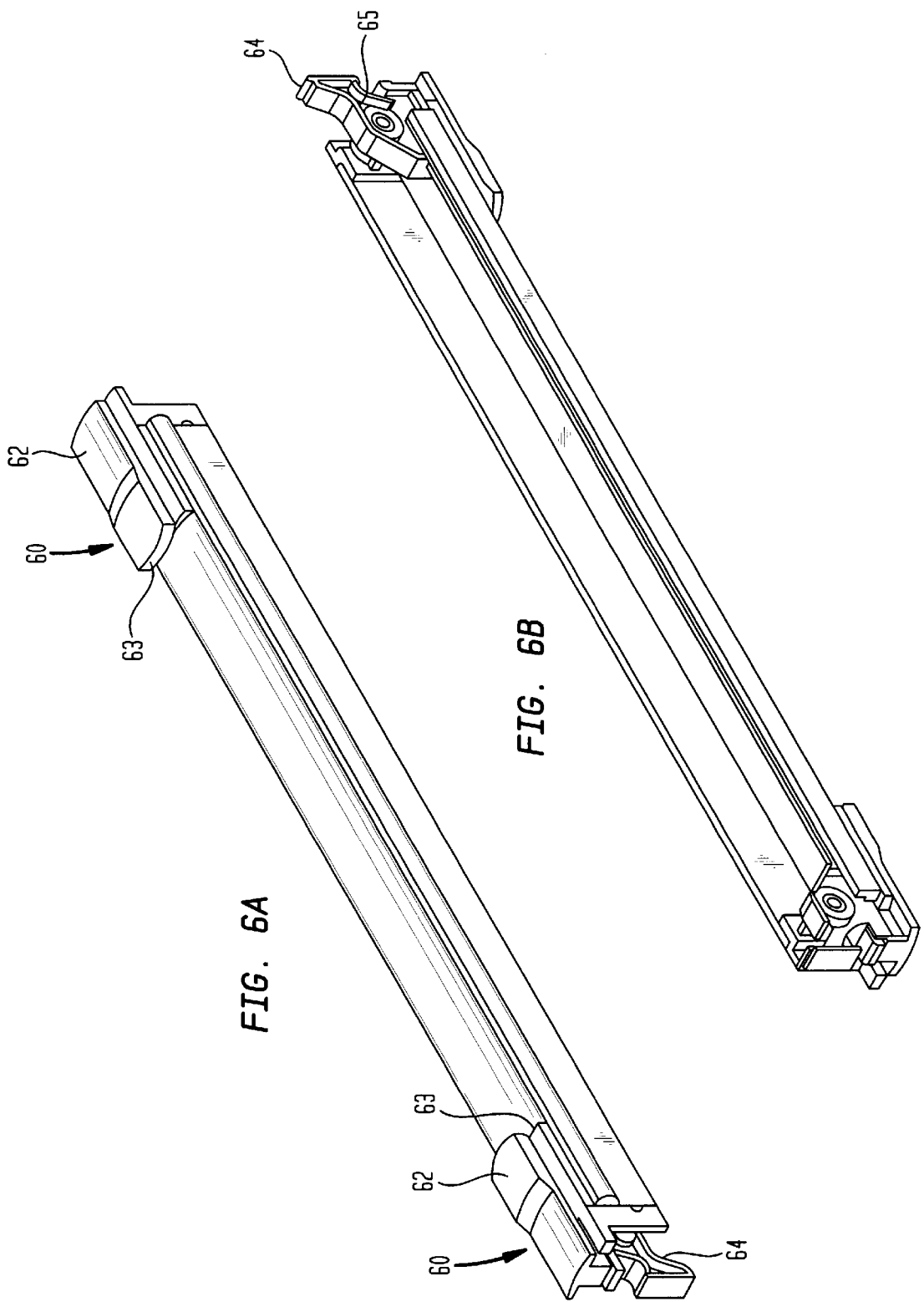

FACEPLATE FOR NETWORK SWITCHING APPARATUS

BACKGROUND OF THE INVENTION

1. Field of the Invention

The present invention relates generally to faceplates which are used in network switching apparatus and, more particularly, to extruded faceplates useful for protecting the network switch from electromagnetic interference (EMI) and electrostatic discharges (ESD).

2. Description of the Related Art

Extrusion is a process in which heated or unheated material, such as plastic, is pushed across a shaping orifice, known as a die, that continually shapes the material into a desired form. (See for example, Tadmor et al., "Principles of Polymer Processing, John Wiley & Sons, New York, pp. 3–7 (1997)). Conventional products formed by extrusion include wires, cables, rods, tubes, pipes and various profiles. For many applications, the desired attributes of the final part cannot be fully achieved with a single plastic material.

Coextrusion is used to combine two or more different materials in the form of a melt through the same die. In a multi-manifold die, the polymer melt streams are confined to individual flow channels until being joined before or directly at the primary die. (See, Encyclopedia of Polymer Science and Engineering, Vol. 6, pp. 608–613 (1988)). Coextrusion allows for multiple materials to be processed concurrently providing the use of, for example, a low-cost, thick structural internal material layer and a thin external material layer for aesthetics, abrasion resistance, weatherability and the like.

Conductive housings are used to provide shielding of a device from electromagnetic radiation. The disruption of an electronic device as a result of electromagnetic radiation is termed electromagnetic interference (EMI). EMI in the context of this disclosure typically includes frequencies within a range of about 50 hertz to about 10 gigahertz. Absorption and reflection energy losses provided by a shield material are proportional to: (1) the thickness of the shield, (2) the magnetic permeability of the shield material, (3) the frequency of the EMI wave, and (4) the surface resistivity of the shield material. While the defining relationships (i.e. frequencies) for refelction and absorption mechanisms are different, EMI shielding effectiveness is enhanced for materials which have a surface resistivity in the range of about $10^{-2}$ to 10 ohm/square. (For the purpose of this discussion, EMI shielding effectiveness will be described in terms of the surface resistivity, however, it is understood that the EMI shielding effectiveness is optionally described in terms of the volume resistivity of the shield material.)

U.S. Pat. No. 4,327,832 describes a container for packaging semiconductor components formed of a coextrusion of electrically conductive and electrically non-conductive plastics. The coextrusion has a body portion formed of electrically conductive opaque plastic to provide EMI shielding and a non-conductive transparent plastic to permit inspection of components within the container.

In addition to EMI shielding, it is desirable to protect electrostatically sensitive electronic components and devices from electrostatic discharge (ESD). The term electrostatic discharge as used in this disclosure refers to the discharge of static electricity from an essentially non-conductive surface. Enclosures are used for dissipating accumulated electric charge to ground. The enclosures typically have surface resistivities in the range of about $10^5$ to $10^{10}$ ohm/square. Materials which exhibit surface resistivities within the range are called static dissipative materials. Materials having surface resistivities within such range, slowly discharge the accumulated electric charge to the ground potential without generation of high current impulse (current spike). For example each current spike becomes spread in time, e.g., over $\frac{1}{100}$ second for a surface resistivity of about $10^{10}$ ohms/square. U.S. Pat. No. 4,906,944 describes a package for an electrostatically sensitive component formed of a first layer of a coextruded film of polyolefin and a copolymer selected from ethylene-acrylic and ethylene-vinyl acetate copolymers, a second layer of an electrically conductive material laminated to the first layer and an outer layer of a static dissipative material adjacent to a side of the second layer opposite the first layer.

A typical conventional telecommunication transmission switch configuration includes a series of bays mounted side-by-side. Each bay has a number of shelves for parallel mounting of circuit packs. Circuit packs comprise electronic circuit boards and electronic components which perform electronic switching. A faceplate is attached to the front edge of each circuit pack. The circuit pack/faceplate assembly is held into the shelves by latches mounted to the top and bottom edges of the faceplates. It is desirable to provide EMI shielding and ESD immunity for the switch. ESD immunity is required to prevent electrostatic discharges, usually carried by craft personnel and their equipment, from discharging through the faceplates and latches onto the circuit packs.

Several types of conductive enclosures which shield network switches from EMI and ESD are known in the art. For example, a conductive enclosure made of metal doors is used to cover the front of each bay, thereby completely covering the faceplates. Also, conventional faceplates formed of metal have been used to provide EMI and ESD shielding. However, metal enclosures and faceplates can be costly, have inherent design limitations and typically require secondary processing, i.e., painting, to produce an acceptable aesthetic surface quality. Another type of conductive enclosure is made of a plastic material that is coated with a conductive layer. Although such coated-plastic enclosures tend to be relatively lightweight, the processes used for forming the conductive layer on the plastic material are expensive, since multiple coating steps are often required to deposit a continuous layer having the desired surface resistivity.

Telecommunication equipment is specified by industry standard documents. Telecommunication network switch equipment has the requirement of providing gaps of at least $\frac{1}{8}$ of an inch between adjacent faceplates on a shelf. The gaps prevent potential binding between the faceplates. However, the gaps produce slots for EMI emission. One conventional solution uses metal gaskets positioned within the gaps of adjacent faceplates to provide EMI shielding.

It is desirable to provide a coextruded faceplate and gasket providing ESD immunity and EMI shielding of the network switch.

SUMMARY OF THE INVENTION

The present invention is directed to a faceplate useful for network switching apparatus. The faceplate attaches to a circuit pack of the network switch. The faceplate has a multi-layered structure which combines a first polymeric material layer with a second polymeric material layer. Materials suitable for forming the multi-layered faceplate are selected to be compatible with coextrusion processes.

An outer portion of the faceplate is formed of the first polymeric material layer. The first polymeric material layer protects the circuit packs from ESD. It is desirable that the first material layer form an external surface of the faceplate to enable dissipation of static charge from objects outside the faceplate. The first polymeric material layer has a composition in which an additive is suspended within a polymeric material in an amount sufficient to provide a surface resistivity within the range of about $10^5$ to about $10^{10}$ ohm/square. Such a surface resistivity enables the first polymeric material layer to dissipate static charge that would otherwise potentially damage the network switch.

An inner portion of the faceplate is formed of the second polymeric material layer. The second polymeric material layer shields the electronic device from EMI. The second material layer has a composition in which a conductive additive is suspended within a polymeric material in an amount sufficient to provide a surface resistivity within the range of about $10^{-2}$ to 10 ohm/square. Such a surface resistivity allows the second material layer to reflect and absorb incident electromagnetic radiation thereby shielding the circuit packs of the network switch from EMI. The second polymeric material layer also shields the outside environment from electromagnetic radiation generated within the circuit packs.

Additives which impart ESD protection for static control in polymeric materials are well known to those skilled in the art and include hygroscopic agents, conductive particles, metallocenes, and conductive polymers. The concentration of the additive suspended in the polymeric material is selected to provide a surface resistivity within the prescribed range. Additives which function as an EMI shield include conductive particles, metallocenes, and conductive polymers. The concentration of the additive suspended in the polymeric material is selected to provide a surface resistivity within the prescribed range. The first polymeric material layer and the second polymeric material layer are rigid after extrusion to provide structural strength to the faceplate.

In one embodiment, the faceplate further comprises a gasket portion protruding laterally from the inner portion of the faceplate. The gasket portion is formed of a third polymeric material layer coextruded with the first polymeric material layer and the second polymeric material layer. The gasket portion shields gaps between adjacent faceplates from EMI. The third material layer has a composition in which an additive is suspended within a polymeric material in an amount sufficient to provide a surface resistivity within the range of about $10^{-2}$ to about 10 ohm/square. The third polymeric material layer is formed of a polymeric material which is flexible after extrusion to allow the gasket portion to be inserted in a gap between an adjacent faceplate.

The faceplate of the present invention is advantageously fabricated using a coextrusion process. The first polymeric material layer and second polymeric material layer are optionally combined with the third polymeric material layer in an extrusion die to shape the polymeric materials into the desired shape of the faceplate.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

BRIEF DESCRIPTION OF THE DRAWINGS

FIG. 6A is a top and side perspective view of latches attached to the coextruded faceplate and gasket shown in FIG. 3A.

FIG. 6B is a bottom perspective view of the latches shown in FIG. 6A.

DETAILED DESCRIPTION

Figure 1:
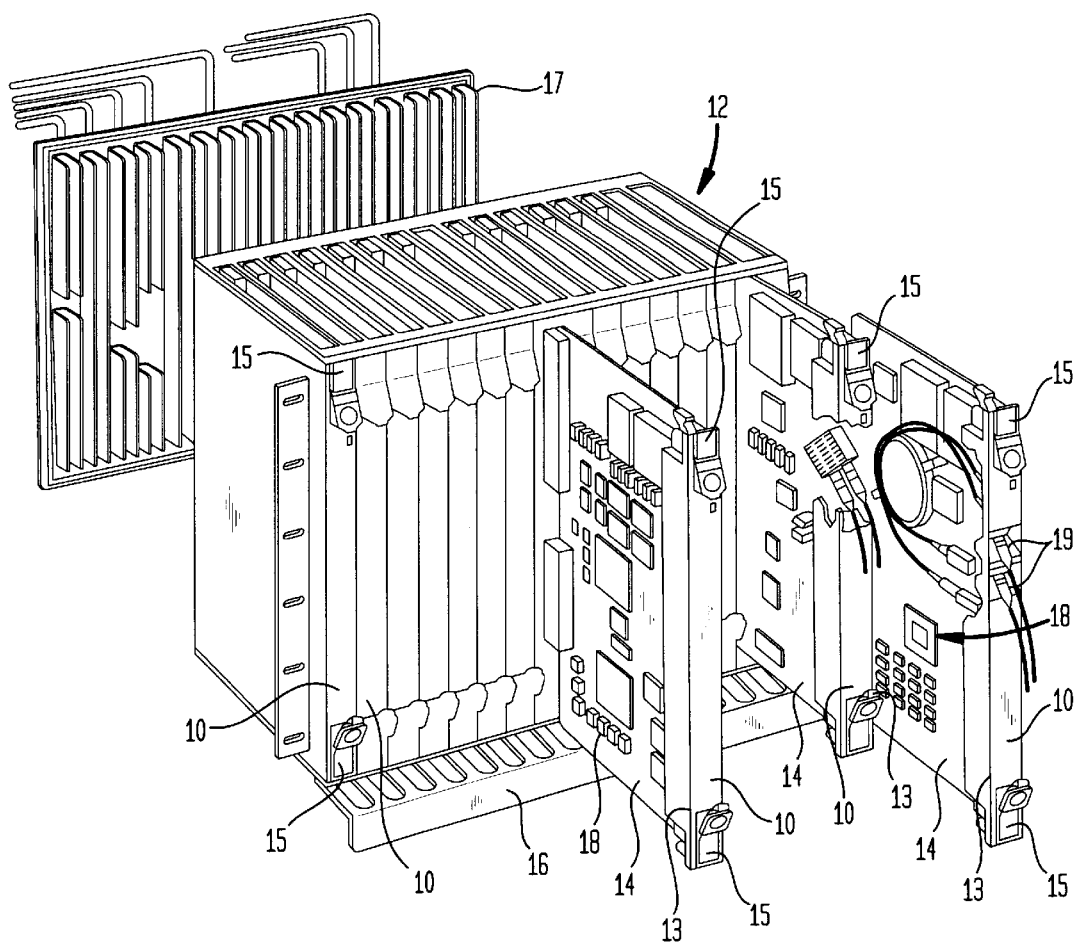
FIG. 1 is a perspective view of a faceplate attached to a network switch.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 illustrates a perspective view of attachment of a prior art faceplate 10 to network switch 12. Faceplate 10 with latch assembly 15 is attached to edge 13 of each circuit pack 14. Each circuit pack 14 is inserted into shelf 16 and is connected to backplane 17. Each circuit pack 14 has a plurality of electronic components 18 which include for example switches, connectors, and light emitting diodes. Electronic components 18 can extend through openings 19 in faceplate 10.

Figure 2A:
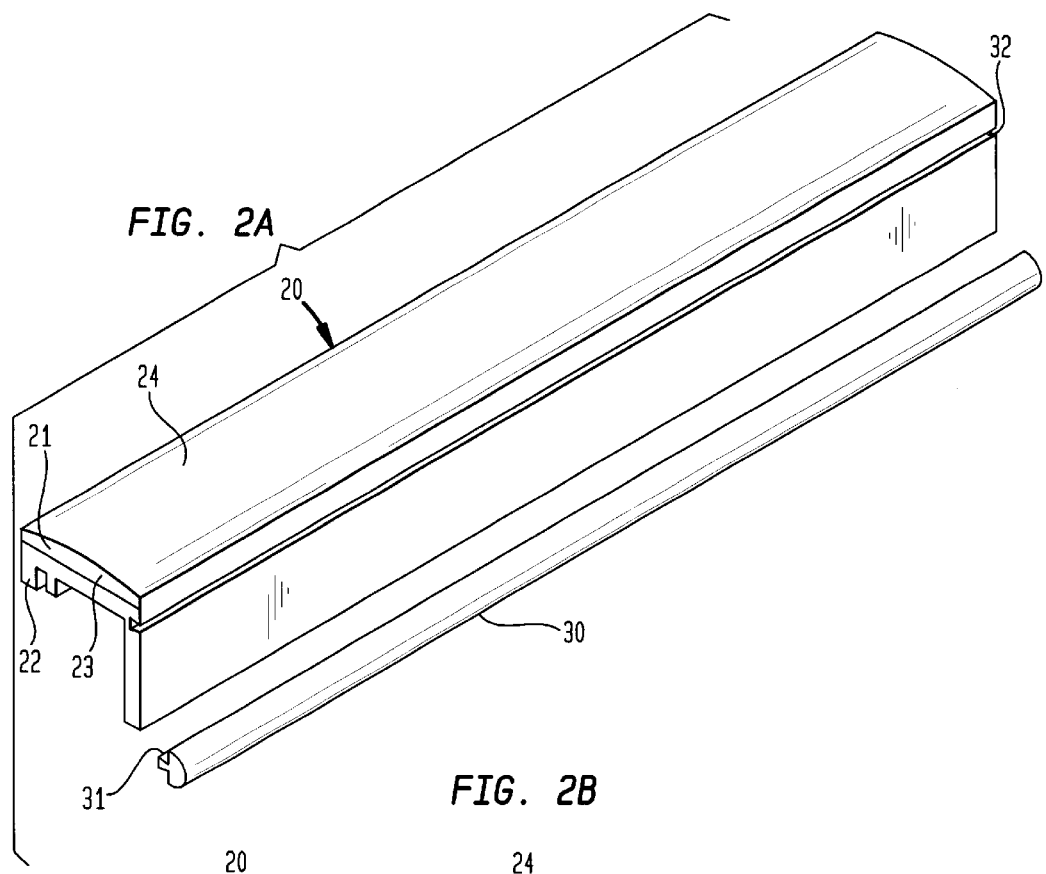
FIG. 2A is a perspective view of a coextruded faceplate which can be attached to a gasket.
Figure 2B:
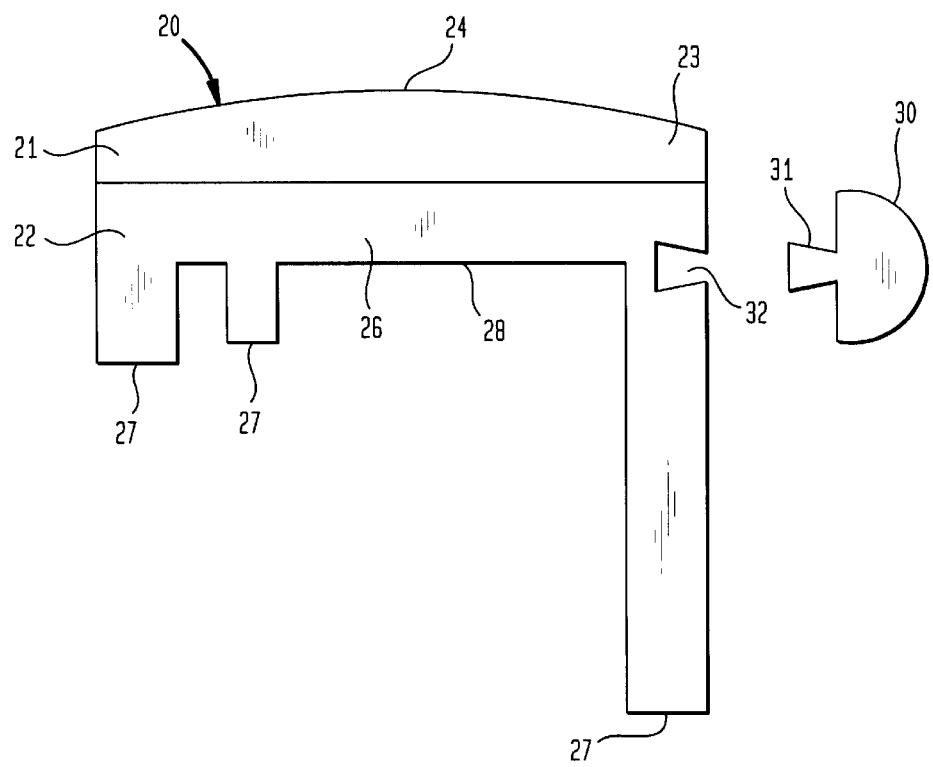
FIG. 2B is a vertical cross section of the faceplate and gasket shown in FIG. 2A.

FIGS. 2A and 2B illustrate coextruded faceplate 20 in accordance with the teachings of the present invention. Coextruded faceplate 20 is attached to the circuit packs of a network switch in a similar manner as faceplate 10. Faceplate 20 protects the network switch from both electrostatic discharge (ESD) and electromagnetic interference (EMI). Faceplate 20 has a coextruded multi-layered structure which combines first polymeric material layer 21 with second polymeric material layer 22. Materials suitable for forming the multi-layered faceplate are selected to be compatible with an extrusion process. First polymeric material layer 21 protects the network switch from electrostatic discharge (ESD). Second polymeric material layer 22 shields the network switch from EMI.

First polymeric material layer 21 forms outer portion 23 of faceplate 20 to enable dissipation of static charge from objects (e.g., fingers, tools) which are proximate to outer surface 24 of outer portion 23. Outer surface 24 has a rounded profile. Alternatively, outer surface 24 has a flat profile (not shown).

First polymeric material layer 21 has a composition in which an additive is suspended within an extrudable polymeric material in an amount sufficient to provide a surface resistivity within the range of about $10^5$ to about $10^{10}$ ohm/square. Such a surface resistivity enables first polymeric material layer 21 to dissipate static charge in a controlled manner such that the voltage of the discharge passes across the surface of the first material to ground, thereby protecting circuit packs of the network switch from ESD.

Examples of suitable additives for first polymeric material layer 21 include metallocenes, conductive polymers and hygroscopic surfactants such as tertiary fatty acids, quaternary ammonium salts, monoalkyl glycerides, alkyl phosphonates, and sulfamides. Alternatively, suitable electrically conductive additives for use in first polymeric material layer 21 include metal coated graphite fibers such as, nickel-coated graphite (NiCG) fibers, nickel copper-coated graphite (NiCuCG) fibers, and nickel copper nickel-coated graphite (NiCuNiCG) fibers and metal fibers, such as nickel-coated copper (NiCCu) fibers, stainless steel (SS) fibers, and metal plated stainless steel (MCSS) fibers. Additives can be in the form of particles, flakes, fibers or powders. The concentration of the additive suspended in the polymeric material is selected to provide a surface resistivity within the prescribed range. ESD extrudable resins are available commercially from RTP Company, Winona, Minn., and Geon Company, Cleveland, Ohio.

Second polymeric material layer 22 forms inner portion 26. Inner portion 26 has a u-shape formed of vertical protrusions 27 extending from horizontal body 28. Inner portion 26 slides over an edge of the circuit pack. It will be appreciated that inner portion 26 can have an alternative shape corresponding to alternative configurations of the circuit packs of the network switch.

Second polymeric material layer 22 has a composition in which a conductive additive is suspended within a polymeric material in an amount sufficient to provide a surface resistivity within the range of about $10^{-2}$ to about 10 ohm/square. Such a surface resistivity allows second polymeric material layer 22 to absorb and/or reflect electromagnetic radiation, thereby shielding the circuit packs of the network switch from EMI. Suitable electrically conductive additives include metal coated graphite fibers such as, nickel-coated graphite (NiCG) fibers, nickel copper-coated graphite (NiCuCG) fibers, and nickel copper nickel-coated graphite (NiCuNiCG) fibers and metal fibers, such as nickel-coated copper (NiCCu) fibers, stainless steel (SS) fibers, and metal plated stainless steel (MCSS) fibers. Additives can be in the form of particles, flakes or fibers. The concentration of the additive suspended in the polymeric material is selected to provide a surface resistivity within the prescribed range. EMI extrudable resins are available commercially from RTP Company, Winona, Minn.

First polymeric material layer 21 and second polymeric material layer 22 are formed of polymeric materials which are rigid after extrusion for providing structural strength to faceplate 20. Examples of polymeric materials suitable for use as first polymeric material layer 21 and second polymeric material layer 22 include acrylonitrile-butadiene-styrene (ABS), polycarbonate (PC), PC/ABS blends, acetal, acrylic nylon, thermoplastic polyester, polyvinylacetate (PVAC), polyethylene (PE), polypropylene (PP), polystyrene, polysulfone and polyvinyl chloride (PVC). It will be appreciated that other thermoplastic polymeric materials suitable for extruding a rigid material known in the art could be used with the teachings of the present invention.

Gasket 30 is formed of material for shielding from EMI the gaps between adjacent faceplates in the network switch. Gasket 30 is formed of flexible metallic material. Suitable examples for use as gasket 30 include an alloy of beryllium and copper (BeCu) and spring steel. It will be appreciated that other flexible metallic materials known in the art could be used for forming the gasket. Alternatively, gasket 30 can be formed of an additive suspended in a flexible or semi-rigid polymeric material. Suitable polymeric materials include polyvinyl chloride (PVC), rubber, thermoplastic elastomer (TPE), polyolefin, polyurethane and copolymers and blends thereof Suitable additives for gasket 30 include the above-described conductive additives useful for second polymeric material layer 22.

Gasket 30 includes protrusion 31. Cavity 32 is formed longitudinally along the length of inner portion 26. Protrusion 31 is received in cavity 32. Upon attachment of faceplate 20 to the circuit pack, gasket 30 is positioned in a gap between an adjacent faceplate.

Figure 3A:
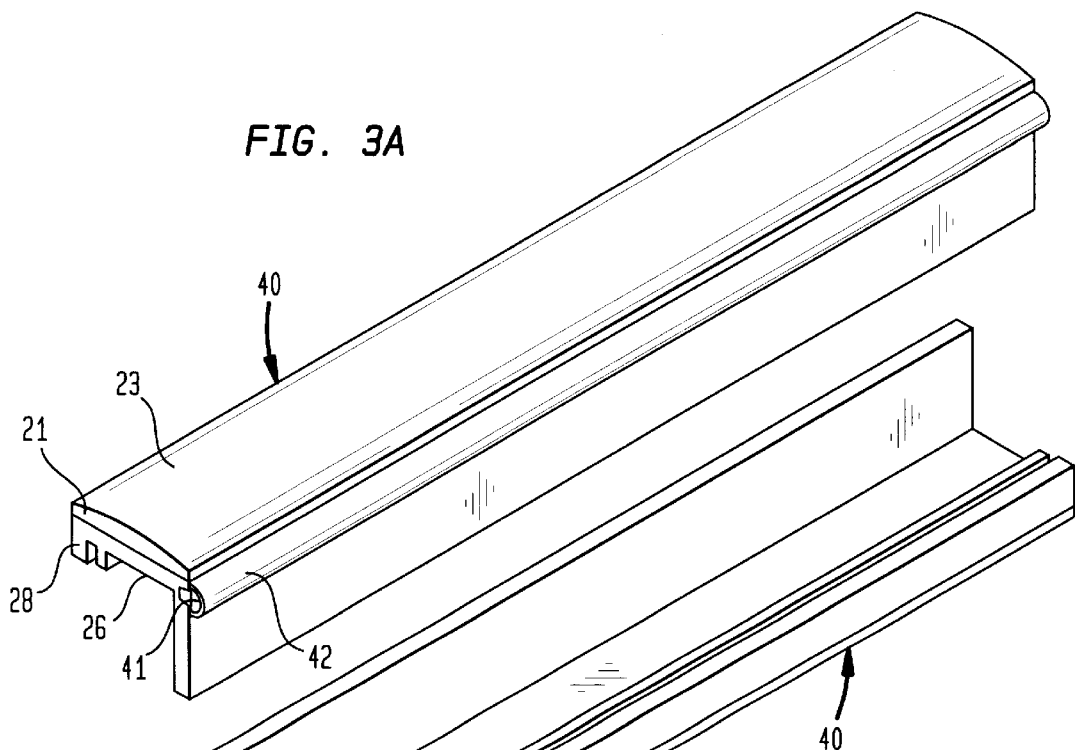
FIG. 3A is a top and side perspective view of a coextruded faceplate and gasket.
Figure 3B:
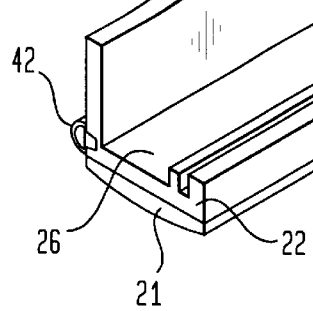
FIG. 3B is a bottom perspective view of the coextruded faceplate and gasket shown in FIG. 3A.
Figure 3C:
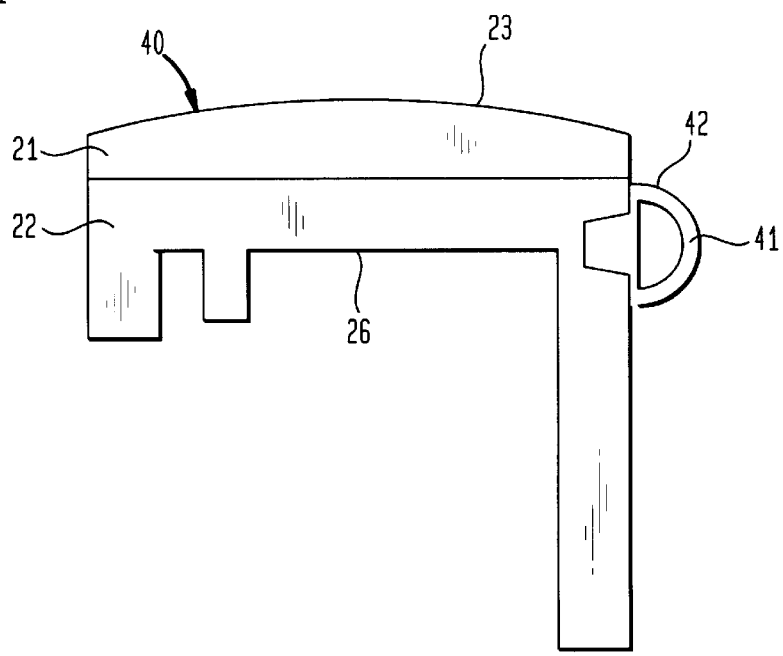
FIG. 3C is a vertical cross section of the coextruded faceplate and gasket shown in FIG. 3A.

Alternatively, faceplate 40 is formed of a coextrusion of a gasket material layer with first polymeric material layer 21 and second polymeric material layer 22, as shown in FIGS. 3A–3C. Gasket portion 42 is formed of a third material layer 41 selected to be compatible in a coextrusion process with first polymeric material layer 21 and second polymeric material layer 22. Gasket portion 42 shields gaps between adjacent faceplates from EMI. Third polymeric material layer 41 has a composition in which an additive is suspended within a polymeric material in an amount sufficient to provide a surface resistivity within the range of about $10^{-2}$ to about 10 ohm/square. Such a surface resistivity allows gasket material portion 42 to absorb and/or reflect electromagnetic radiation, thereby shielding the gaps between the circuit packs of the network switch from EMI. Suitable electrically conductive additives include metal coated graphite fibers such as, nickel-coated graphite (NiCG) fibers, nickel copper-coated graphite (NiCuCG) fibers, and nickel copper nickel-coated graphite (NiCuNiCG) fibers and metal fibers, such as nickel-coated copper (NiCCu) fibers, stainless steel (SS) fibers, and metal plated stainless steel (MCSS) fibers.

Figure 4:
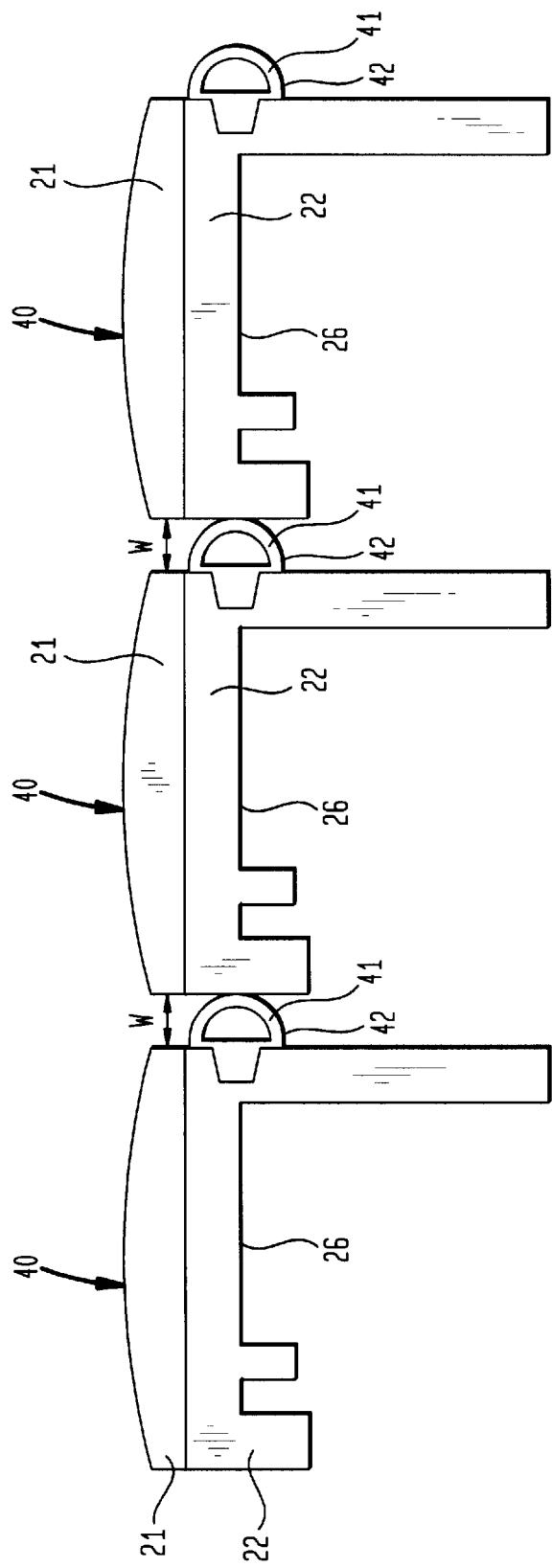
FIG. 4 is a vertical cross section of three coextruded faceplates and gaskets each faceplate attached to an adjacent circuit pack.

Gasket portion 42 protrudes laterally from inner portion 26. Gasket portion 42 has a width, w, substantially corresponding to or being within about 0.01 inch to about 0.1 inch larger than the width of gap 43 located between adjacent faceplates 40, as shown in FIG. 4. Third polymeric material layer 41 is formed of a polymeric material which becomes flexible or semi-rigid material after the extrusion process to allow gasket portion 42 to be flexed into gap 43 between adjacent faceplates 40. Examples of flexible materials suitable for use as gasket layer 42 include polyvinyl chloride (PVC), rubber, thermoplastic elastomer (TPE), polyolefin, polyurethane and copolymers and blends thereof.

Figure 5A:
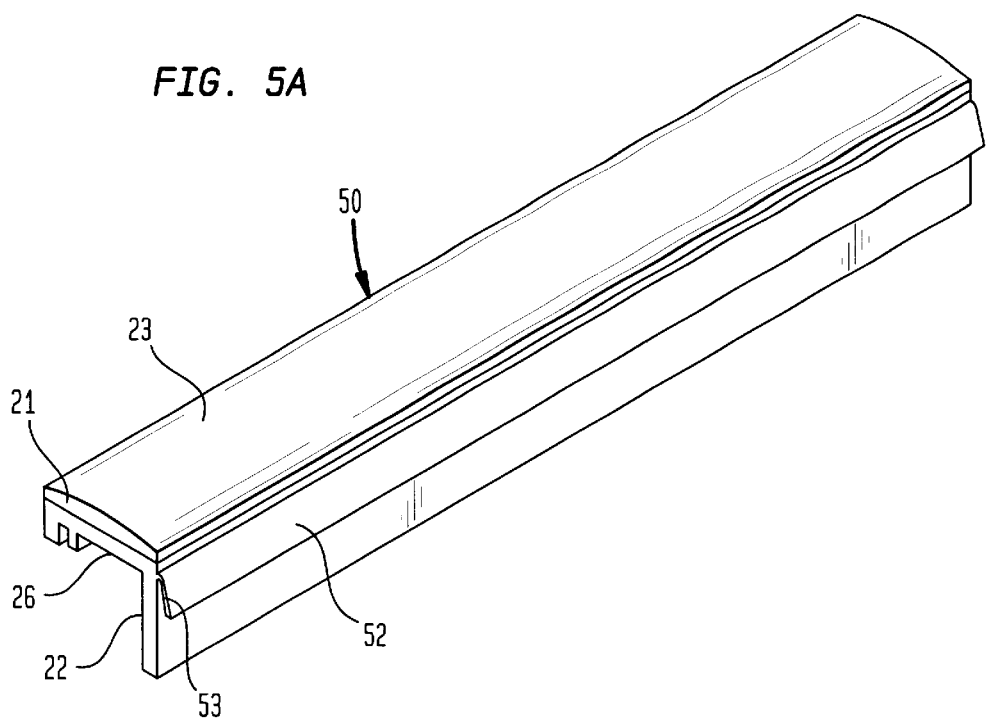
FIG. 5A is a top and side perspective view of an alternative embodiment of a coextruded faceplate and gasket.
Figure 5B:
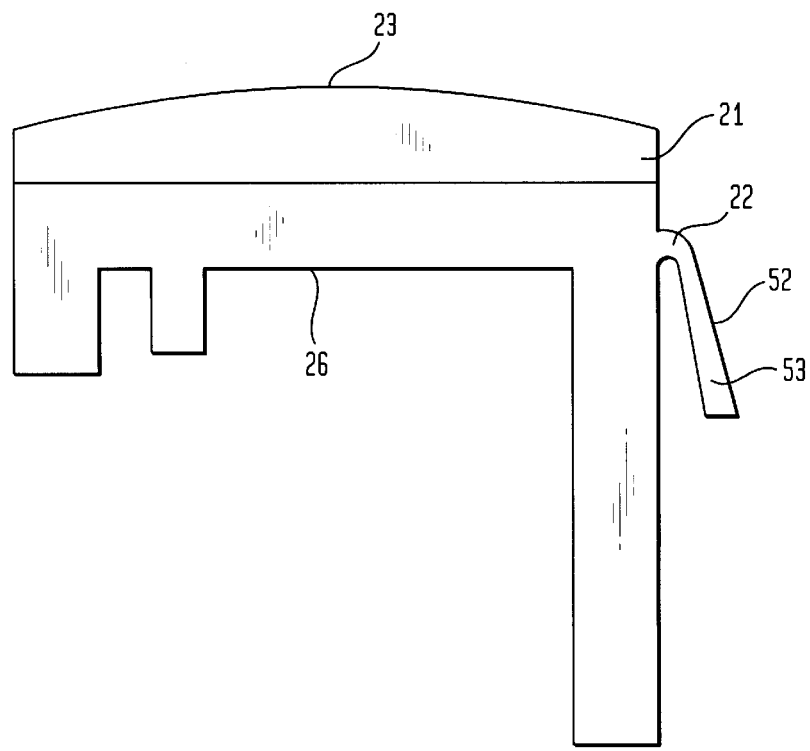
FIG. 5B is a vertical cross section of the coextruded faceplate and gasket shown in FIG. 5A.

Alternatively, a coextruded faceplate 50 has a structure in which gasket 52 is formed as a protrusion 53 of second polymeric material layer 22, as depicted in FIGS. 5A and 5B. Second polymeric material layer 22 is extruded into the shape of inner portion 26 and gasket 52. Gasket 52 protrudes laterally along the length of inner portion 26. Protrusion 53 is designed using design guidelines for snap-fits for rigid polymeric materials to allow flexing of gasket 52 into the gap between adjacent faceplates.

Conductive fibers typically have a graphite core with a diameter in the range of about 5 microns to about 10 microns and are coated with about 0.5 microns to about 3 microns thick layer of metal. Conductive fibers are generally bundled into about 3,000 to about 12,000 fiber rovings which are impregnated with a resin binder to hold the fibers together. The rovings are chopped into pellets having a length in the range of from about 0.0625 inch to about 0.5 inch to be useful for dry-blending with polymeric materials. Suitable conductive additives include metal coated graphite fibers available commercially from Composite Materials, LLC, Mamoroneck, N.Y., nickel-coated graphite fibers available commercially from INCO Specialty Powder Products, Wyckoff, N.J. and stainless steel fibers available commercially from Bekaert Fibre Technologies, Marietta, Ga.

The surface resistivity of first polymeric material layer 21, second polymeric material layer 22, gasket 30, gasket portion 42 and gasket 52 is dependent on the composition and amount of additive that is suspended within the polymeric material. It has been found that conductive fibers having an aspect ratio of the length to diameter in the range of about 100:1 to about 2000:1 in an amount of at least about 5% by weight and no greater than about 25% by weight suspended in the polymeric material are sufficient to provide surface resistivity of second material layer 22, gasket 30, gasket portion 42 and gasket 52 within the prescribed range for EMI shielding. Conductive fibers having an aspect ratio of the length to diameter in the range of about 100:1 to about 2000:1 in an amount of less than about 5% by weight suspended in the polymeric material are sufficient to provide surface resistivity of first polymeric material layer 21 within the prescribed range for ESD immunity.

The thickness of first polymeric material layer 21 does not limit its ability to provide ESD protection, since the static charges are dissipated across the surface of such layer to ground. However, some additives such as hygroscopic surfactants, tend to migrate to the surface and potentially evaporate from the material layer. Thus, when the first polymeric material layer 21 includes hygroscopic surfactants, it is desirable that the thickness of outer portion 23 contain an amount of additive sufficient to provide ESD protection during the service life of the molded article.

The thickness of the second polymeric material layer 22 which provides EMI shielding is dependent on the desired EMI shielding effectiveness based on the concentration of a specific additive suspended in the polymeric material which imparts EMI shielding. A suitable thickness of each of vertical protrusions 27 and horizontal body 28 is in the range of about 0.05 inches to about 0.25 inches. A suitable thickness for gasket 30, gasket portion 42 and gasket 52 is about 0.025 inch to about 0.15 inch.

Additionally, to provide effective ESD capability, the surface of outer portion 23 is connected to a ground potential. Second polymeric material layer 22, gasket 30, gasket portion 42 or gasket 52 conduct electricity through the layers and therebetween to provide a path for the electromagnetic wave. Accordingly, either inner portion 26 or the gasket can be connected to ground to provide effective EMI shielding. Inner portion 26, gasket 30, gasket portion 42 or gasket 52 are optionally connected to ground by interconnection to the ground connection of network switch 12 using metal clips, screws, fasteners or a similar conductive device.

FIGS. 6A and 6B illustrate latch assembly 60 and attachment of latch assembly 60 to faceplate 40. Latch assembly 60 can be formed using injection molding. Latch assembly 60 is formed of latch plate 62 and rotating member 64. Latch plate 62 is bonded to ends 63 of faceplate 40 using conventional chemical and physical processes, such as heat staking and ultrasonic welding. An edge of the shelf of network switch 12 is received in cavity 65 of rotating member 64. The circuit pack having an attached faceplate is inserted into the shelf of the network switch. Latch assembly 60 can also be used with faceplate 20 and faceplate 50 for attaching the faceplates to the network switches.

Figure 7:
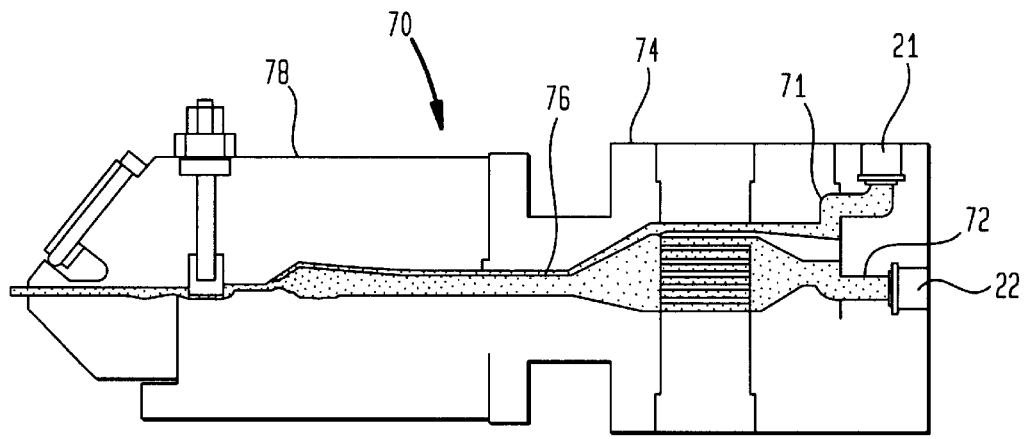
FIG. 7 is a schematic diagram of a coextrusion process useful for making the coextruded faceplate of the present invention.

The multi-layered faceplate 20 and faceplate 50 are formed using a coextrusion process, as shown in FIG. 7. First polymeric material layer 21 flows in channel 71 and second material layer 22 flows in channel 72 of extruder 70. First polymeric material layer 21 and second polymeric material layer 22 are combined in feedblock 74.

Figure 8:
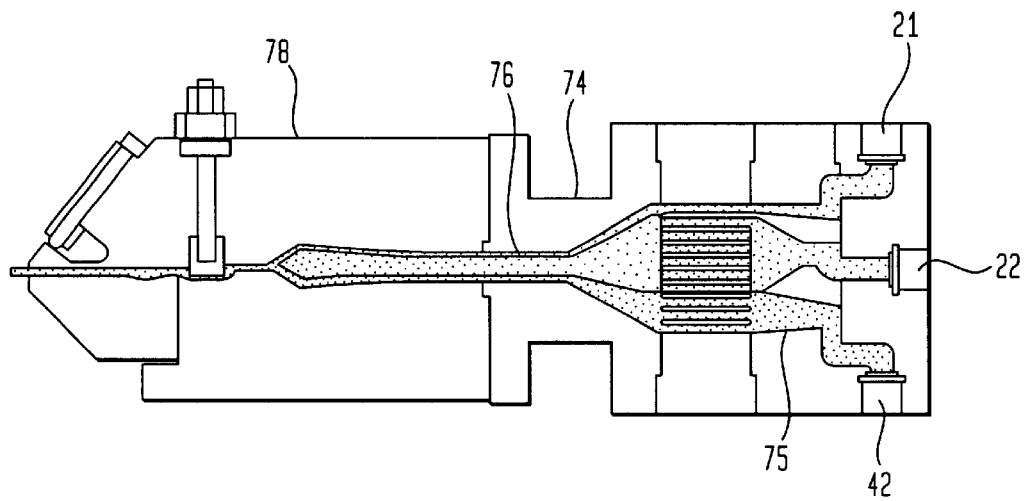
FIG. 8 is a schematic diagram of a coextrusion process useful for making the coextruded faceplate and gasket of the present invention.

Faceplate 40 can be formed using a coextrusion process shown in FIG. 8. Third polymeric material layer 41 flows in channel 75 and is combined with first polymeric material layer 21 and second material layer 22 in feedblock 74.

The respective combined materials flow together as a polymeric melt 76 into extrusion die 78. Heat and pressure applied to polymeric melt 76 in extrusion die 78 shapes polymeric melt to define a desired shape of outer portion 23, inner portion 26 and optionally gasket portion 42 or gasket 52. The faceplate then proceeds to subsequent conventional cooling, cutting and stamping operations (not shown).

Conditions required for extruding first polymeric material layer 21 and second polymeric material layer 22 optionally with third material layer 41 within a coextrusion process depend on the temperatures and viscosities of such materials and are well known to those skilled in the art. Typically, coextrusion is favored by using polymeric materials with similar melt temperatures (within about 100° F.) and viscosities (within about 10 Pa-sec). It is also important that the polymeric materials adhere to each other at their mutual interface. Adhesion is favored by using polymeric materials having similar compositions or compatible compositions which are bonded by heat activation. For example, if the polymeric material used to form the first polymeric material layer is polycarbonate, then adhesion between the first polymeric material layer and the second polymeric material layer is favored if the second polymeric material layer is also polycarbonate. Alternatively, if the polymeric material used to form the second polymeric material layer is polycarbonate, then adhesion between the second polymeric material layer and the third polymeric material layer is favored if the material of the third polymeric material layer is heat activated to bond with the second polymeric material layer.

The following example will serve to further typify the nature of this invention but should not be construed as a limitation in the scope thereof, which scope is defined solely by the appended claims.

EXAMPLE

A faceplate for telecommunications network switching apparatus was formed using a coextrusion process for polymeric materials. An extrusion die was made for coextruding three separate polymeric materials into one congruent profile useful as a faceplate. Three extrusion grade polymeric materials were processed separately in three extruder barrels as standard extrusion equipment available from Cincinnati Milacron, Batavia, Ohio and using extrusion process parameters suitable for each polymeric material determined by the material suppliers and well know to those skilled in the art. The three extruded polymeric materials were continuously ejected under heat and pressure from the three extruder barrels into the feedblock of the extrusion die. The three polymeric material melts were combined in the extrusion die feedblock into one congruent polymeric material melt. The shape of the feedblock flow channels and the profile of the extrusion die define the resulting profile and locations of the three polymeric material melts. The congruent three polymeric material profile exiting the extrusion die enters a series of three calibrators to continuously maintain extrusion profile during cooling of the polymeric material melt in a water submersion. The faceplate profile then entered a cutting station to segment the continuous profile in the appropriate length for the faceplate.

The three polymeric materials consisted of polyvinyl chloride (PVC) resins commercially available from Geon Company, Cleveland, Ohio. A first rigid PVC resin, grade 87262 from Geon, was dry blended with nickel-copper-nickel (NiCuNi) coated graphite fibers from Composite Materials, L.L.C., Mamaroneck, N.Y. at a 15% by weight ratio of fibers to resin resulting in an electrically conductive rigid polymeric material with a surface resistivity in the range of $10^{-2}$ to 10 ohms/square and used for EMI shielding in the faceplate. A second rigid PVC resin, grade MP570 from Geon, was blended with an anti-static compound available from RTP Company, Winona, Minn., resulting in an electrically conductive rigid polymeric material with a surface resistivity in the range of $10^5$ to $10^{10}$ ohms/square and used for ESD immunity on the surface of the faceplate. A third flexible PVC resin, grade C7000 from Geon, was blended with nickel coated graphite powders from INCO Speciality Powder Products, Wyckoff, N.J., resulting in an electrically conductive flexible polymeric material with a surface resistivity in the range of $10^{-2}$ to 10 ohms/square and used for EMI shielding in the faceplate gasket.

It is to be understood that the above-described embodiments are illustrative of only a few of the many possible specific embodiments which can represent applications of the principles of the invention. Numerous and varied other arrangements can be readily devised in accordance with these principles by those principles by those skilled in the art without departing from the spirit and scope of the invention.

What is claimed:

1. A faceplate for network switching apparatus comprising:
   a multilayered structure formed integrally by coextrusion of at least a first polymeric material layer and a second polymeric material layer, the structure including an outer portion formed of the first polymeric material layer, said first polymeric material layer having a surface resistivity within the range $10^5$ to $10^{10}$ ohm/square to act as an anti-static material; and
   further including an inner portion formed of the second polymeric material layer having a surface resistivity within the range $10^{-2}$ to 10 ohm/square to act as an electromagnetic shielding material.

2. The faceplate of claim 1 wherein said first polymeric material layer has a composition in which an additive is suspended within a polymeric material.

3. The faceplate of claim 2 wherein said polymeric material is selected from the group consisting of acrylonitrile-butadiene styrene (ABS), polycarbonate (PC), PC/ABS blends, acetal, acrylic nylon, thermoplastic polyester, polyvinyl acetate (PVAC), polyethylene (PE), polypropylene (PP), polystyrene, polysulfone and polyvinylchloride (PVC).

4. The faceplate of claim 3 wherein said additive is selected from the group consisting of hygroscopic surfactants, conductive particles, metallocenes, and conductive polymers.

5. The faceplate of claim 1 wherein said second polymeric material layer has a composition in which an additive is suspended within a polymeric material.

6. The faceplate of claim 5 wherein said polymeric material is selected from the group consisting of acrylonitrile-butadiene styrene (ABS), polycarbonate (PC), PC/ABS blends, acetal, acrylic nylon, thermoplastic polyester, polyvinyl acetate (PVAC), polyethylene (PE), polypropylene (PP), polystyrene, polysulfone and polyvinylchloride (PVC).

7. The faceplate of claim 6 wherein said additive is present in an amount of at least 5% by weight of said second polymeric material layer and no greater than 25% by weight.

8. The faceplate of claim 6 wherein said additive is selected from the group consisting of:
   conductive particles, conductive flakes, conductive fibers and conductive powders.

9. The faceplate of claim 8 wherein said additive comprises conductive particles having an aspect ratio in the range 100:1 to 2000:1.

10. The faceplate of claim 6 wherein said additive is selected from the group consisting of nickel-coated graphite (NiCG), nickel copper-coated graphite (NiCuCG) fibers, nickel copper nickel-coated graphite (NiCuNiCG) fibers, nickel-coated copper (NiCCu) fibers, stainless steel (SS) fibers, and metal plated stainless steel (CuCSS) fibers.

11. The faceplate of claim 1 wherein a cavity is formed longitudinally along the length of said inner portion.

12. The faceplate of claim 1 further comprising:
    a gasket portion formed of a third polymeric material layer, said gasket portion protruding laterally from said inner portion, said third polymeric material layer is an electromagnetic magnetic shielding material having a surface resistivity within the range of $10^{-2}$ to about 10 ohm/square.

13. The faceplate of claim 12 wherein said third polymeric material layer has a composition in which an additive is suspended within a polymeric material.

14. The faceplate of claim 13 wherein said polymeric material is selected from the group consisting of polyvinylchloride (PVC), rubber, thermoplastic elastomer, polyolefin, polyurethane, copolymers thereof and blends thereof.

15. The faceplate of claim 14 wherein said additive is present in an amount of at least 5% by weight of said polymeric material and no greater than 25% by weight.

16. The faceplate of claim 15 wherein said additive is selected from the group consisting of:
    conductive particles, conductive flakes, conductive fibers and conductive powders.

17. The faceplate of claim 16 wherein said additive comprises conductive fibers having an aspect ratio in the range 100:1 to 2000:1.

18. The faceplate of claim 17 wherein said additive is selected from the group consisting of nickel-coated graphite (NiCG), nickel copper-coated graphite (NiCuCG) fibers, nickel copper nickel-coated graphite (NiCuNiCG) fibers, nickel-coated copper (NiCCu) fibers, stainless steel (SS) fibers, and metal plated stainless steel (CuCSS) fibers.

19. The faceplate of claim 12 wherein said third polymeric material layer is selected to be formed integrally with said first polymeric material layer and said second polymeric material layer into the multi-layer structure by coextrusion.

20. The faceplate of claim 1 further comprising:
    a gasket formed as a protrusion extending laterally from said inner portion, said gasket formed of said second polymeric material layer.

21. The faceplate of claim 20 wherein said first polymeric material layer and said second polymeric material layer are selected to be formed integrally into the multi-layer structure by coextrusion.

22. A faceplate for network switching apparatus having a multi-layered structure comprising:
 an outer portion formed of a first polymeric material layer, said first polymeric material layer is an anti-static material having a surface resistivity within the range $10^5$ to $10^{10}$ ohm/square;
 an inner portion formed of a second polymeric material layer, said second polymeric material layer is an electromagnetic shielding material having a surface resistivity within the range $10^{-2}$ to 10 ohm/square, said inner portion including a cavity formed longitudinally along the length of said inner portion; and
 a gasket having an edge received in said cavity, said gasket being formed of an electromagnetic shielding material having a surface resistivity within the range $10^{-2}$ to 10 ohm/square.

23. The faceplate of claim 22 wherein said gasket is formed from a material selected from the group consisting of a metallic material and an additive suspended within a polymeric material.

24. The faceplate of claim 23 wherein said gasket is formed from a polymeric material including a suspended additive and said polymeric material is selected from the group consisting of acrylonitrile-butadiene styrene (ABS), polycarbonate (PC), PC/ABS blends, acetal, acrylic nylon, thermoplastic polyester, polyvinyl acetate (PVAC), polyethylene (PE), polypropylene (PP), polystyrene, polysulfone and polyvinylchloride (PVC).

25. The faceplate of claim 24 wherein said additive is present in an amount of at least 5% by weight of said polymeric material and no greater than 25% by weight.

26. The faceplate of claim 25 wherein said additive is selected from the group consisting of nickel-coated graphite (NiCG), nickel copper-coated graphite (NiCuCG) fibers, nickel copper nickel-coated graphite (NiCuNiCG) fibers, nickel-coated copper (NiCCu) fibers, stainless steel (SS) fibers, and metal plated stainless steel (CuCSS) fibers.

* * * * *